United States Patent
Thomas

(10) Patent No.: US 9,121,600 B2
(45) Date of Patent: Sep. 1, 2015

(54) ILLUMINATED WALLPAPER SYSTEM

(71) Applicant: Russell Alexander Thomas, Saint Clair, MO (US)

(72) Inventor: Russell Alexander Thomas, Saint Clair, MO (US)

(*) Notice: Subject to any disclaimer, the term of this patent is extended or adjusted under 35 U.S.C. 154(b) by 0 days.

(21) Appl. No.: 14/296,806

(22) Filed: Jun. 5, 2014

(65) Prior Publication Data

US 2015/0003066 A1 Jan. 1, 2015

Related U.S. Application Data

(60) Provisional application No. 61/831,315, filed on Jun. 5, 2013.

(51) Int. Cl.
| | |
|---|---|
| *F21S 8/00* | (2006.01) |
| *F21V 33/00* | (2006.01) |
| *F21V 23/00* | (2015.01) |
| *H01L 33/00* | (2010.01) |

(52) U.S. Cl.
CPC .............. *F21V 33/006* (2013.01); *F21V 23/003* (2013.01); *H01L 33/00* (2013.01)

(58) Field of Classification Search
CPC ............... H05B 33/0845; H05B 33/12; H05B 33/0857; H05B 33/0803; F21S 8/04; F21V 23/003; F21V 23/045; F21V 23/04; F21Y 2101/02; F21Y 2105/00; F21Y 2105/001
USPC .............. 362/146–148, 225, 217.2, 240, 244, 362/246, 249.01, 249.02, 249.04, 362/249.14–249.17, 311.01, 311.02, 326, 362/330; 257/98–100
See application file for complete search history.

(56) References Cited

U.S. PATENT DOCUMENTS

| | | | |
|---|---|---|---|
| 2008/0080200 A1* | 4/2008 | Robbins et al. | 362/487 |
| 2008/0191220 A1* | 8/2008 | Daniels et al. | 257/88 |
| 2014/0328052 A1* | 11/2014 | Hochman et al. | 362/147 |

* cited by examiner

*Primary Examiner* — Hargobind S Sawhney
(74) *Attorney, Agent, or Firm* — Doster Greene, LLC

(57) ABSTRACT

An illuminated wallpaper system according to various embodiments can include a laminated wallpaper and an electronic control unit. The laminated wallpaper can be configured to include a bottom layer and an outer layer. A flexible circuit board is interdisposed between the bottom layer and the outer layer. The electronic control unit wirelessly or directly connects to the laminated wallpaper for controlling the operation of the laminated wallpaper.

18 Claims, 4 Drawing Sheets

ILLUMINATED WALLPAPER SYSTEM

I. FIELD OF THE INVENTION

The present disclosure relates to laminated wallpaper.

II. BACKGROUND OF THE INVENTION

Traditional wallpaper is a nonwoven (paper) or woven (fabric) backing, decoratively printed for application to walls of a residence or business to impart style, atmosphere, or color into a room. It is usually sold in rolls and applied onto a wall using wallpaper paste. The wallpaper is typically hung vertically on a wall. Patterns can be printed onto the wallpaper by one of several printing methods, including surface printing, gravure printing, rotary printing, silk-screen printing and digital printing. Designers choose the printing technique based on cost as well as aesthetics.

However, the printed image or pattern of traditional wallpaper is permanent, unchanging and non-interactive. Once applied to the wall, the image of the wallpaper remains the same. In order to change the image, the wallpaper must be stripped and removed from the wall, and a new wallpaper containing a different image reapplied.

Therefore, a wallpaper is needed that enables one or more features of the image of the wallpaper to be dynamically changed.

III. SUMMARY OF THE INVENTION

The present invention may satisfy one or more of the above-mentioned desirable features. Other features and/or advantages may become apparent from the description which follows.

In at least one aspect, the present disclosure provides an illuminated wallpaper system, comprising a laminated wallpaper. The laminated wallpaper includes a bottom layer and an outer layer. The flexible circuit board is positioned between the bottom layer and the outer layer. An electronic control unit wirelessly or directly is connected to the laminated wallpaper for controlling operation of the laminated wallpaper.

In at least one aspect, the present disclosures provides a method of illuminating a wallpaper system comprising providing a laminated wallpaper including a bottom layer and an outer layer; attaching a flexible circuit board between the bottom layer and the outer layer; and connecting an electronic control unit wirelessly or directly to the laminated wallpaper for controlling operation of the laminated wallpaper.

IV. BRIEF DESCRIPTION OF THE DRAWINGS

Figure 1:
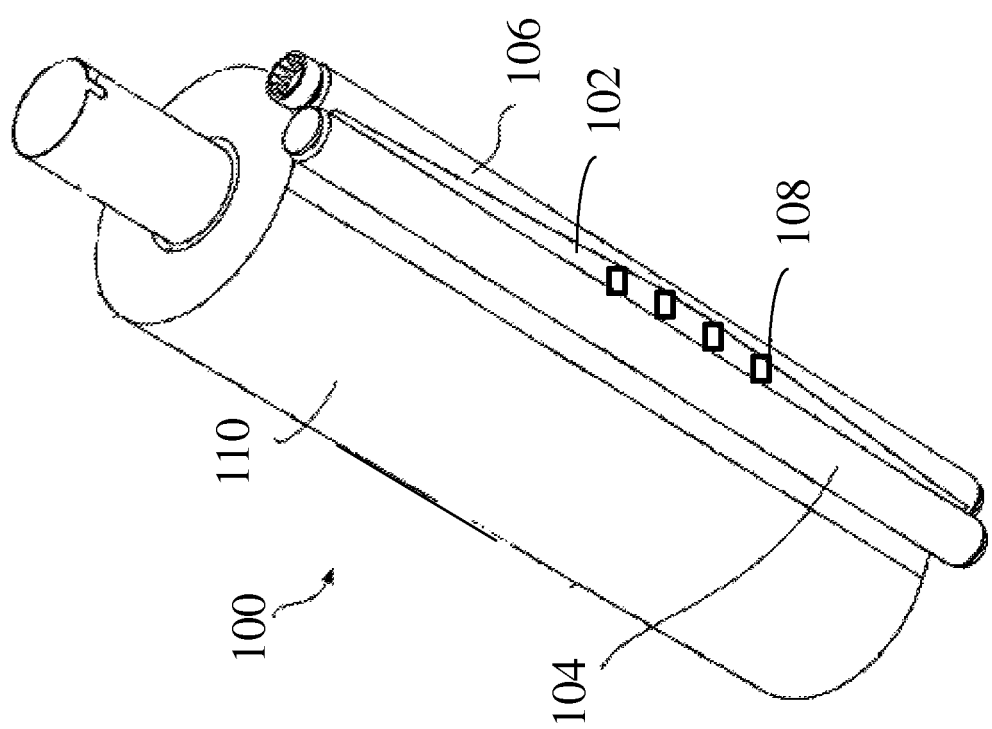
FIG. 1 illustrates a perspective view of a roll of wallpaper in accordance with the present teachings.

The present disclosure may take form in various components and arrangements of components, and in various process operations and arrangements of process operations. The present disclosure is illustrated in the accompanying drawings, throughout which, like reference numerals may indicate corresponding or similar parts in the various figures. The drawings are only for purposes of illustrating preferred embodiments and are not to be construed as limiting the disclosure. Given the following enabling description of the drawings, the novel aspects of the present disclosure should become evident to a person of ordinary skill in the art.

V. DETAILED DESCRIPTION OF THE DRAWINGS

The following detailed description is merely exemplary in nature and is not intended to limit the applications and uses disclosed herein. Further, there is no intention to be bound by any theory presented in the preceding background or summary or the following detailed description. While embodiments of the present technology are described herein primarily in connection with neural tissue retractor sheaths, the concepts are also applicable to other types of sheaths and removal and repair of various body tissues.

FIG. 1 depicts generally an illuminated wallpaper 100 that is a laminated paper wherein a flexible circuit board 102 is positioned between two laminated layers (an outer layer 104 and a bottom layer 106). The flexible circuit board 102 conducts electricity to light emitting diodes (LEDs) lights 108 that pierce through the outer laminated paper shell so that when a voltage is applied to the circuitry, the lights 108 light up all simultaneously or in a timed pattern, etc. In various embodiments, rolls 110 of the laminated wallpaper can be applied onto the wall such that the respective edges overlap where the circuits can electrically connect on the overlap portion allowing each rolled layer on the wall to complete a circuit.

Figure 2:
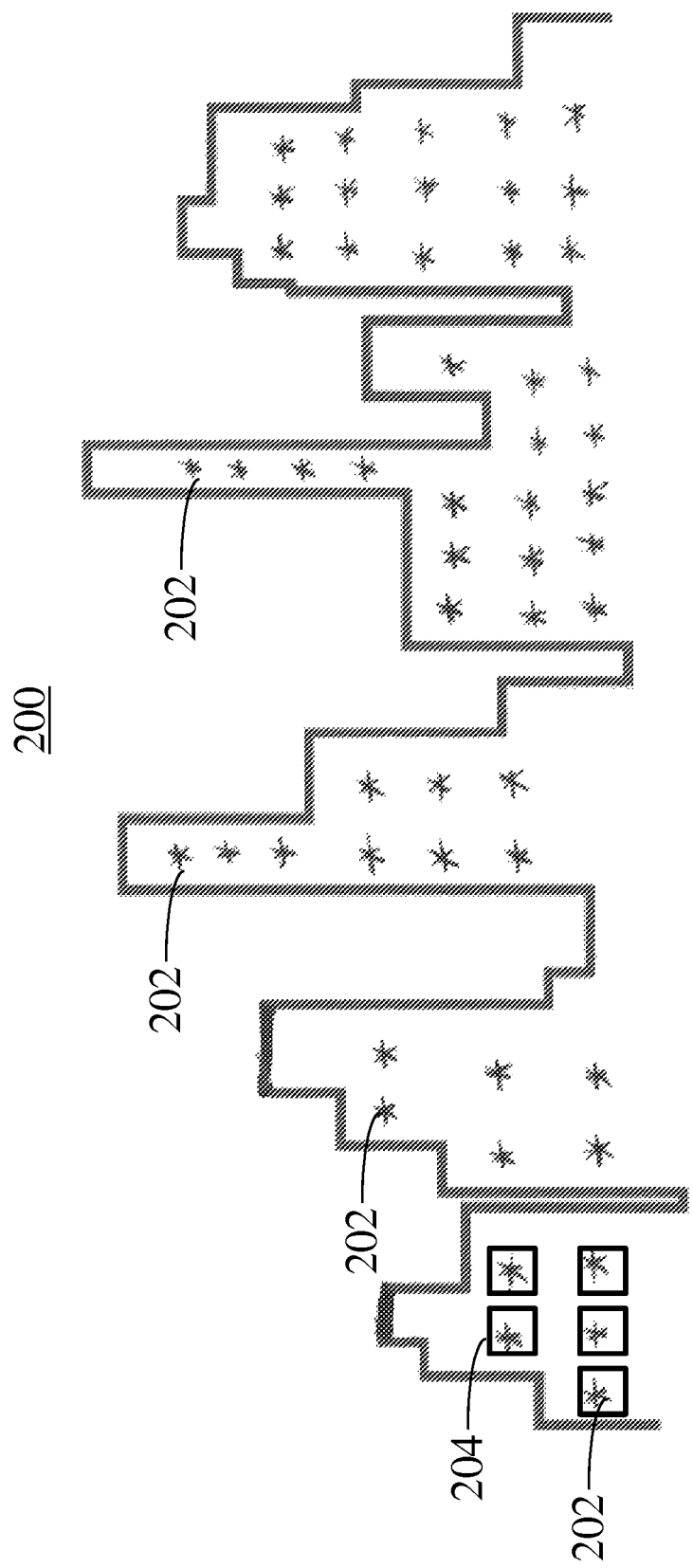
FIG. 2 illustrates a front view of the illuminated wallpaper in accordance with the present teachings.

For example, as shown in FIG. 2, the outer layer 200 of the wallpaper can depict a picture of a city including perforations 204 such that the lights 202 pierce through at certain locations to show a lighted city. In various embodiments, the pattern of the LED lighting scheme may comprise different colored lights.

Figure 3:
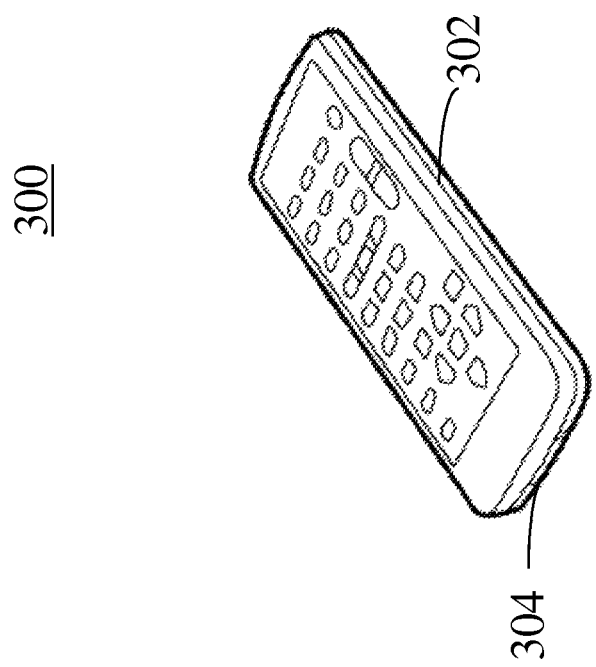
FIG. 3 illustrates a remote control device cable of interacting with the illuminated wallpaper in accordance with the present teachings.

In various embodiments, there can be a small diode battery (not shown) included in the circuitry and a handheld remote transmitter 300, shown in FIG. 3. A person in the room with the wallpaper can operate the remote 300 to manually, remotely or wirelessly control the lights as desired.

In lieu of the flexible circuit board being positioned between the outer and bottom layers, in various embodiments, a portion of the circuit may be attached directly to the bottom layer of wallpaper and the remaining portions of the circuits are attached directly to the outer layer of the wallpaper such that the outer layer is applied directly to the bottom layer in a superimposed manner to complete the circuit.

In some embodiments, the electrical circuits may be applied only to either the outer layer or the bottom layer of the wallpaper.

Various embodiments may include a control circuit that receives data from a timing detection circuit in order to produce illumination light pattern according to the received data.

In various embodiments, the wallpaper may be illuminated to display, for example, images of pictures, letters, characters, people, phrases, places and things.

Various embodiments may also include a sound generating device controlled by a controller to produce sounds, such as music, soothing sounds, a dialogue or storytelling. For example, the played sounds may be programmed to correspond with the illumination pattern, such as in a bedtime storytelling mode.

In various embodiments, the strips of wallpaper may be made and sold in predetermined lengths corresponding to the walls to which it is desired to apply the paper or the strips may be rolled for convenience in handling. Various embodiments may be sold as a kit including several interchangeable flexible circuit boards, outer layers and bottom layers, which can be combined in a manner based on the user's preferences.

Various embodiments of the outer layer of the wallpaper may include wall fabric or textile, or a combination of paper and fabric, or other wall decorating sheet material. Those skilled in the art would recognize a variety of materials or fabrics that may be used as wallpaper.

In various embodiments, the illuminated wallpaper system may include a controller having programmable settings that can be controlled by the user to select various lighting and/or sound combinations.

The circuitry may include an electronic unit. The battery provides the power source for the electronic unit, which can be turned on or off by operating an on/off switch. In some embodiments, the battery may be configured as a rechargeable battery that can be recharged when mounted to a charging base. Alternatively, the power source can be a replaceable power source, such as a replaceable battery, similar to a hearing aid battery. As the power source operates to provide power to the electronic circuit and other components, the electronic circuit operates to process inputs received to illuminate the wallpaper, display images and/or produce sound effects.

The electronic unit can include a multi-processor system. The operation of the multi-processor system can be controlled by internal control software. The control software may include routines, programs, objects, components, and/or data structures that perform particular tasks that can be viewed as an operating system together with one or more applications. The operating system provides management and control functions which are utilized by the applications to offer user functions such as control of the illuminated wallpaper. A programmable remote control device having control features to adjust levels, change settings, and/or select programs can be used in conjunction with the illuminated wallpaper for wireless transmission of signals to the illuminated wallpaper.

In various embodiments, the remote control device can be programmable to add timed lighting displays and/or sound effects with numerous possible programming sequences. Using the programmable remote control, the user can design and save numerous different sequences. The remote control device can be configured to playback, for example, programmed lighting and/or sound sequences. Thus, the electronic unit can operate in response to user selections, adjustments or preferences programmed, selected or entered by the user using the remote control device.

The programmable remote control device can be configured to wirelessly transmit remote control signals to control the illuminated wallpaper so that it can be controlled from a distance. Activation of the control features 302, depicted in FIG. 3, of the remote control device 300 by the user, such as pressing a button, rotating a thumbwheel, activating a touchscreen, or initiating voice activation, causes the remote control device to transmit an infrared or radio wave remote control signal as a command to a receiver of the illuminated wallpaper for controlling it. The remote control device can be configured with one or more buttons for as adjusting the timing sequence and/or the volume control to control the functions of the illuminated wallpaper.

Figure 4:
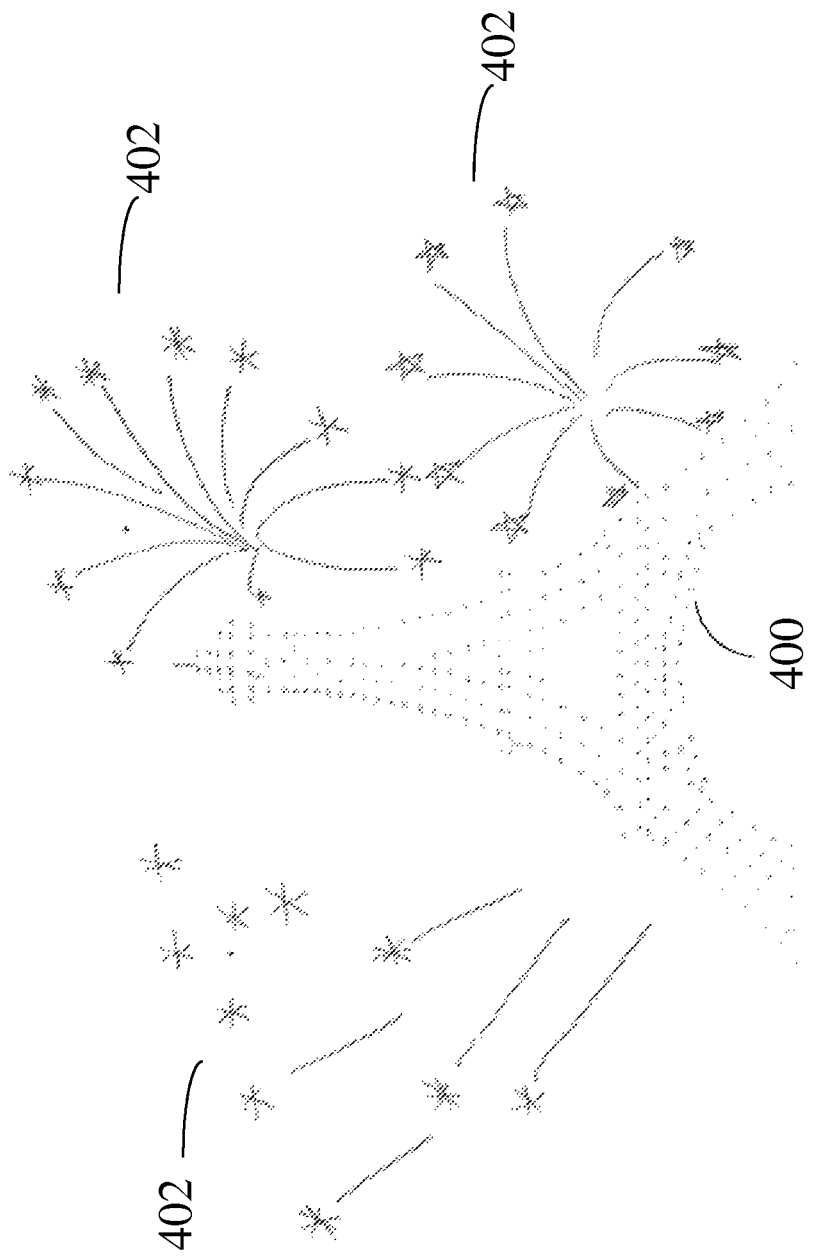
FIG. 4 illustrate a front view of another embodiment of the illuminated wallpaper in accordance with the present teachings.

As shown in FIG. 4, in various embodiments, the images displayed within the illuminated wallpaper system may be dynamically changed. In various embodiments, the LED lights may be attached outwardly to form an array on the outer layer. When illuminated, they provides an illuminated background. In such an embodiment, the remote 300 may be provided with a slot 304 configured to receive a memory card (not shown). The memory card may be programmed to store various images and/or sounds. Using the remote 300 in conjunction with the electronic circuitry, an image may be displayed or projected onto the illuminated background. In the example shown in FIG. 4, the displayed image 400 is illustrated as a dotted outline to indicate that it is temporarily displayed on the outer layer of the wallpaper system. The image 400 may be automatically or manually changed using the control settings 302 on the remote control 300. The lighting pattern of the LED lights 402 can be programmed to selectively operate in coordination with the sequence of the displayed image. In this example, the LED lights 402 are selectively lit to depict a firework demonstration surrounding an image 400 of the Eiffel Tower.

Those skilled in the art will also appreciate that various adaptations and modifications of the preferred and alternative embodiments described above can be configured without departing from the scope and spirit of the disclosure. Therefore, it is to be understood that, within the scope of the appended claims, the disclosure may be practiced other than as specifically described herein.

I claim:

1. An illuminated wallpaper system, comprising:
a laminated wallpaper including a bottom layer and an outer layer, wherein the laminated wall paper pasted on a wall surface, and not reusable after its removal from the wall surface
a flexible circuit board interdisposed between the bottom layer and the outer layer; and
an electronic control unit wirelessly or directly connected to the laminated wallpaper for controlling operation of the laminated wallpaper; the bottom layer and the top layer configured such that applying the outer layer to the flexible circuit board attached to the bottom layer completes the electrical circuit to conduct electricity to the light emitting diode (LED) lights.

2. The system of claim 1, further comprising perforations in the outer layer through which the LED lights protrude so that when a voltage is applied to circuitry of the flexible circuit board the LED lights are illuminated.

3. The system of claim 2, wherein the LED lights are illuminated in a uniform manner or based upon a time pattern sequence.

4. The system of claim 2, wherein the illuminated LED lights and the outer layer display images of at least one of a picture, a letter, a character, people, a phrase, a place and a thing.

5. The system of claim 2, further comprising a sound generating device to produce sound effects that correspond with illumination of the LED lights.

6. The system according to claim 2, further comprising images displayed on the outer layer of the wallpaper using the electronic control unit.

7. The system according to claim 6, wherein the images displayed on the wallpaper are dynamically changed using the electronic unit.

8. The system according to claim 7, wherein lighting patterns of the LED lights are programmed to selectively operate as a background in coordination with the sequence of the displayed image.

9. The system of claim 1, wherein rolls of laminated wallpaper are applied onto a wall such that respective edges of each roll of laminated wallpaper overlap so that corresponding circuits connect allowing each rolled layer of wallpaper to complete a circuit.

10. The system of claim 1, wherein a portion of the electrical circuit is attached to the bottom layer of the wallpaper and the remaining portion of the electrical circuits is attached to the outer layer of the wallpaper so that the outer layer is applied directly to the bottom layer in a superimposed manner to complete the circuit.

11. The system of claim 1, wherein the electrical circuits are applied only to the outer layer or the bottom layer of the wallpaper.

12. The system according to claim 1, wherein the electronic control unit comprises a multi-processor system.

13. The system according to claim 1, further comprising a controller having programmable settings which are controllable by a user to select various lights, images and/or sound combinations.

14. A method of illuminating a wallpaper system, comprising:
  providing a laminated wallpaper including a bottom layer and an outer layer, wherein the laminated wall paper pasted on a wall surface, and not reusable after its removal from the wall surface
  attaching a flexible circuit board between the bottom layer and the outer layer; and
  connecting an electronic control unit wirelessly or directly to the laminated wallpaper for controlling operation of the laminated wallpaper; the bottom layer and the top layer configured such that applying the outer layer to the flexible circuit board attached to the bottom layer completes the electrical circuit to conduct electricity to the light emitting diode (LED) lights.

15. The method of claim 14, further comprising perforations in the outer layer through which the LED lights protrude so that when a voltage is applied to circuitry of the flexible circuit board the LED lights are illuminated.

16. The method of claim 14, wherein rolls of laminated wallpaper are applied onto a wall such that respective edges of each roll of laminated wallpaper overlap so that corresponding circuits connect allowing each rolled layer of wallpaper to complete the circuit.

17. The method of claim 14, wherein a portion of the electrical circuit is attached to the bottom layer of the wallpaper and the remaining portion of the electrical circuits is attached to the outer layer of the wallpaper so that the outer layer is applied directly to the bottom layer in a superimposed manner to complete the circuit.

18. The method of claim 14, wherein the electrical circuits are applied only to the outer layer or the bottom layer of the wallpaper.

\* \* \* \* \*